(12) United States Patent
Price et al.

(10) Patent No.: US 8,436,650 B2
(45) Date of Patent: May 7, 2013

(54) PROGRAMMABLE LOGIC DEVICE

(75) Inventors: Neil Price, Bristol (GB); Andrea Olgiati, Newport (GB)

(73) Assignee: Panasonic Corporation, Osaka (JP)

( * ) Notice: Subject to any disclaimer, the term of this patent is extended or adjusted under 35 U.S.C. 154(b) by 21 days.

(21) Appl. No.: 13/075,653

(22) Filed: Mar. 30, 2011

(65) Prior Publication Data
US 2012/0249179 A1 Oct. 4, 2012

(51) Int. Cl.
*H03K 19/177* (2006.01)
(52) U.S. Cl. .............................. 326/41; 326/38; 326/80
(58) Field of Classification Search .............. 326/37–41, 326/47, 112, 113
See application file for complete search history.

(56) References Cited

U.S. PATENT DOCUMENTS 6,737,925 B1   5/2004   Logue et al.
7,417,454 B1 * 8/2008   Rahman et al. ................. 326/38

* cited by examiner

*Primary Examiner* — Jany Tran
(74) *Attorney, Agent, or Firm* — Panasonic Patent Center

(57) ABSTRACT

A programmable logic device includes a plurality of logic blocks and a plurality of routing networks. One of the plurality of routing networks includes a first selection circuit, a second selection circuit, and an auxiliary power connector circuit. The first selection circuit is connected to the second selection circuit via a signal line. The signal line is connected to a power supply line via the auxiliary power connector circuit.

8 Claims, 7 Drawing Sheets

PROGRAMMABLE LOGIC DEVICE

TECHNICAL FIELD

The technical field relates to the field of programmable logic devices (including field programmable gate arrays) and in particular, but not exclusively, to routing networks for reconfigurable devices.

BACKGROUND ART

Programmable logic devices (PLDs) exist as a well-known type of integrated circuit (IC) that may be programmed by a user to perform specified logic functions. There are different types of programmable logic devices, such as programmable logic arrays (PLAS), complex programmable logic devices (CPLDs) and field programmable gate arrays (FPGAs).

A well-known phenomenon occurring in electric circuits is the ΔV=IR voltage drop. Whenever a current I flows through a conductor of resistance R, a difference in potential ΔV=IR occurs between the two terminals of the conductor. In ICs, this manifests itself in the fact that the voltage presented at the actual logic gates is not the nominal voltage presented at the SoC—instead, a lower voltage appears, causing a performance degradation (speed reduction).

This is caused by the fact that the power supply circuits are not ideal (they have Rsupply!=0).

Conventionally, external voltage signals are provided to internal die interconnections of integrated circuits such as PLDs, application specific integrated circuits (ASICS), and others, to provide local input power to internal circuitry and integrated circuits. Unfortunately, due to variations in integrated circuit power consumption, IR drops between integrated circuits and external voltage sources can negatively affect local integrated circuit input voltage levels and therefore affect integrated circuit performance. For example, with regard to PLDs, as timing oscillator circuits may be affected by changes to input voltage levels, variations in such input voltage levels to such a timing oscillator circuit may introduce fluctuations in timing clock signal frequency that may lead to incorrect PLD operation.

Others have attempted to resolve IR drop issues by providing a global reference voltage and on-chip global power regulation at some if not all of various integrated circuits localities. However, power regulation often relies on expensive voltage regulators that consume valuable die space. Others have relied on increasing the size and number of power and ground interconnections, and in some cases providing separate power and ground planes. Unfortunately, while increasing the amount and size of the power interconnections or even adding a power and ground plane, may help reduce IR drops, it also requires the use of valuable die space and increases the complexity of the die, especially as die sizes shrink to accommodate the demand for smaller integrated circuits. There is some technology as written in the patent reference 1 to provide power regulation apparatus relatively small, but still there is a need for significant area.

Patent reference 1: U.S. Pat. No. 6,737,925

The solutions to the IR problem discussed so far all rely on the fact that, in a traditional SoC, it is possible to predict with some accuracy the amount of current $I_{component}$ consumed by each component of the SoC (for instance, the CPU, or a video encoder). Using this knowledge, it is possible to size the power supply to each component appropriately: a heavily-used component (for instance, a CPU) will likely be connected to a larger-than-normal power supply (which will have a small R). Other, smaller, components, on the other hand, may only need a smaller power supply (large R) because their current consumption is lower.

This approach, however, is not possible with PLDs. Due to the inherent programmability of PLDs, during the fabrication process it is not possible to predict which regions of the PLD will be heavily used and which ones will be lightly used: such a choice is made by the programming toolchain used to program the device.

As a consequence of this uncertainty, it is common practice to size power supplies for the worst case (heavy utilization) in all regions of the PLD, so as to be able to support any application placement chosen by the programming toolchain.

SUMMARY

Technical Problem

Accordingly, it would be desirable and useful to provide techniques to resolve the IR drop issues in PLDs without significant area consumption.

In view of the above, as well as other concerns, a programmable logic device according to an embodiment includes a plurality of logic blocks and a plurality of routing networks, wherein one of the plurality of routing networks comprises a first selection circuit, a second selection circuit, and an auxiliary power connector circuit, wherein the first selection circuit is connected to the second selection circuit via a signal line, the signal line is connected to a power supply line via the auxiliary power connector circuit.

A programmable logic device according to an embodiment includes a plurality of logic blocks and a routing network. The routing networks comprises: a first selection circuit configured to receive a plurality of first input signals and to generate a first output signal; a second selection circuit configured to receive a plurality of second input signals and to generate a second output signal, wherein one of the plurality of second input signals is the first output signal from the first selection circuit, an auxiliary power connector circuit coupled to the first and second selection circuits via a switch circuit; and a control portion for providing control signals to the first and second selection circuits, and to the switch circuit, the control portion configured to selectively control the first and second selection circuits and the switch circuit so that the first selection circuit supplements a power supply or a ground line to the second selection circuit when the first selection circuit is in a supplemental operative state.

The programmable logic device according to another aspect, the control portion places the switch circuit in a conductive state to connect the first selection circuit to one of the power supply or the ground line of the second selection circuit when the first selection circuit is in the supplemental operative state, and places the switch circuit in a non-conductive state when the second selection circuit is in calculation operative state.

The programmable logic device according to another aspect further comprises: a third selection circuit configured to receive a plurality of third input signals and to generate a third output signal; and another auxiliary power connector circuit coupled to the third and second selection circuits via another switch circuit, wherein one of the plurality of second input signals received by the second selection circuit is the third output signal from the third selection circuit, wherein the control portion is further configured to provide control signals to the first, second and third selection circuits, and to the switch circuit and the another switch circuit so that the third selection circuit supplements the power supply or the ground line to the second selection circuit when the third selection circuit is in a supplemental operative state.

The programmable logic device according to another aspect, the control portion places the another switch circuit in a conductive state to connect the third selection circuit to one of the power supply or the ground line of the second selection circuit when the third selection circuit is in the supplemental operative state, and places the another switch circuit in a non-conductive state when the third selection circuit is in calculation operative state.

The programmable logic device according to another aspect, the second selection circuit includes an arithmetic logic unit (ALU), and the second output signal is a result of calculation of the plurality of second input signals.

According to the various embodiments, the speed of the whole PLD can be improved.

DESCRIPTION OF EMBODIMENTS

Embodiment 1

Figure 1:
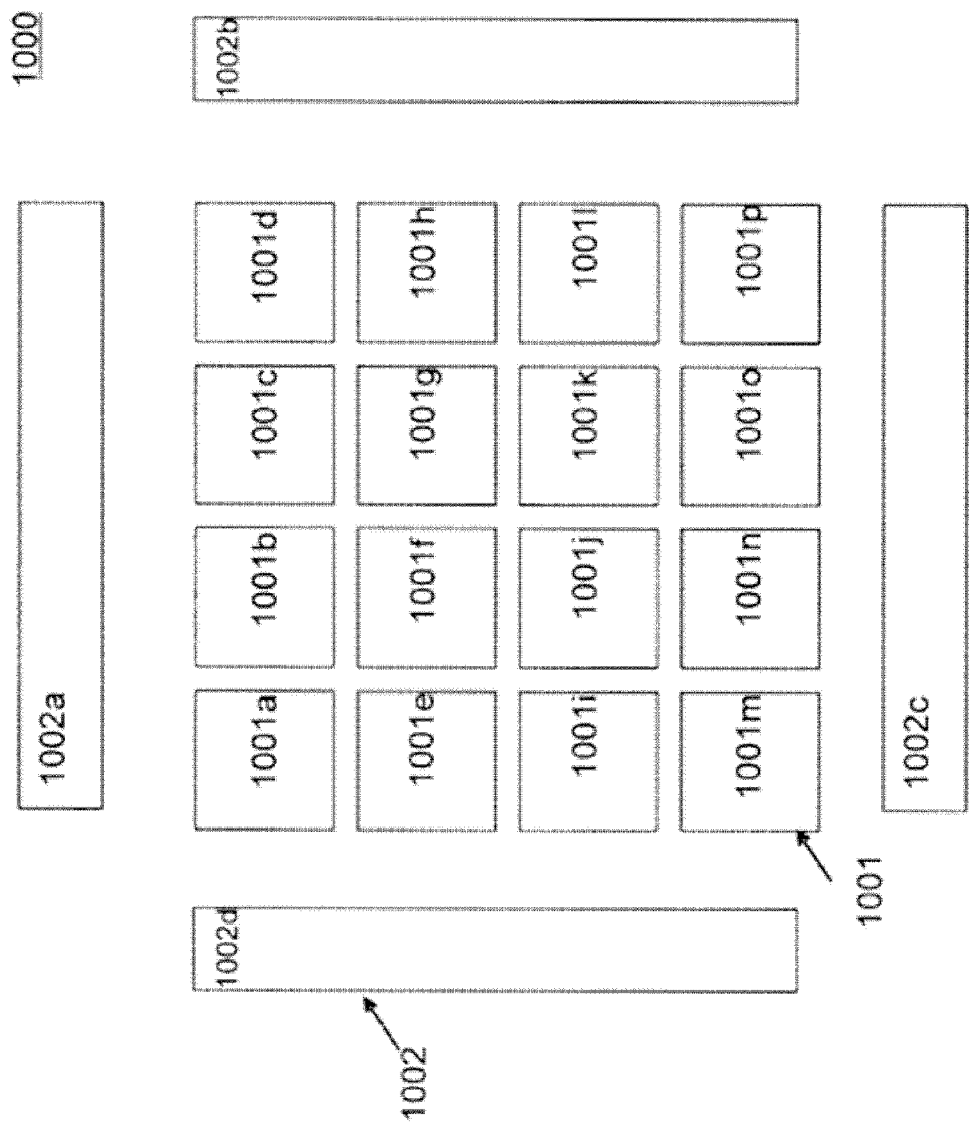
FIG. 1 is a diagram illustrating a simplified architecture of a programmable logic device (PLD).

FIG. 1 illustrates a simplified architecture of a programmable logic device (PLD) 1000 of the present invention in plan view. The PLD 1000 includes an array of tiles 1001a-1001p, programmable input/output (I/O) blocks 1002a-1002d. Some of the tiles 1001a-1001p and I/O blocks 1002a-1002d are connected by a number of connecting lines (not shown in FIG. 1). Clock signals are distributed by, for example, clock trees such as a balanced tree (e.g. the H clock tree).

Figure 2:
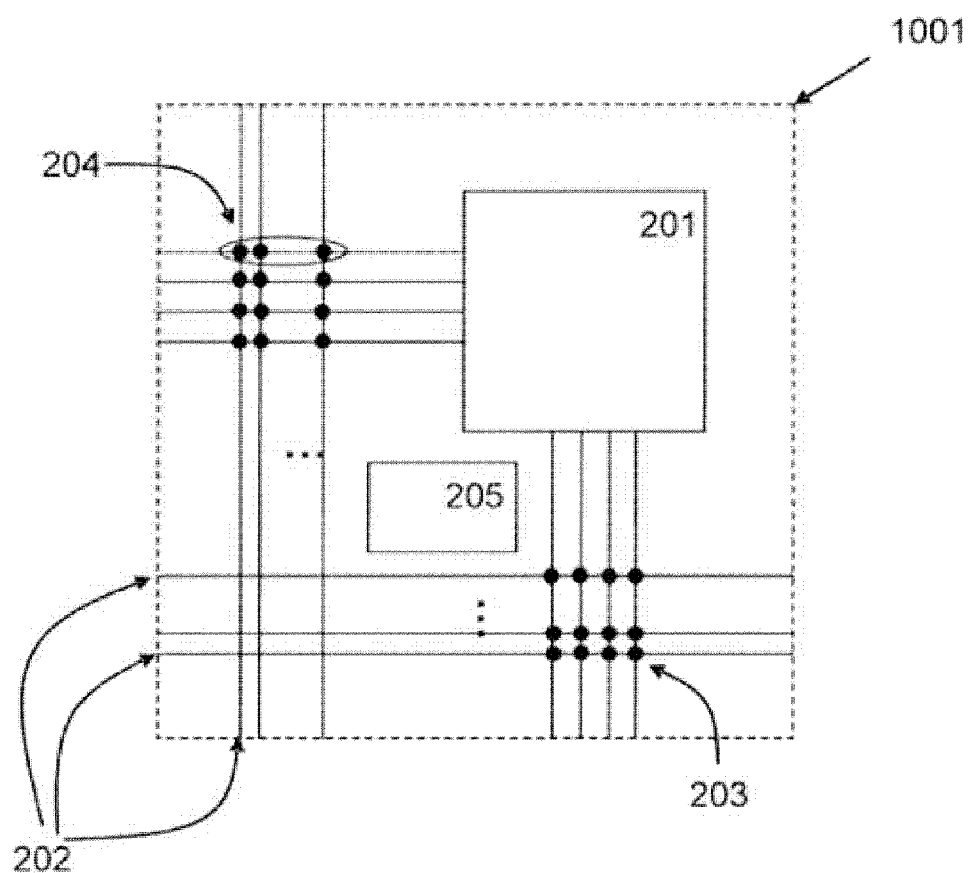
FIG. 2 is a simplified diagram of a tile.

FIG. 2 shows a simplified illustration of a tile 1001, which is one of the tiles 1001a-1001p. The tiles 1001a-1001p have similar structure. In other words, the tile 1001 is a repeating unit of the PLD 1000. The tile 1001 includes a logic block 201, a number of interconnecting lines 202 and configuration memory block 205. The logic block 201 includes logic circuits and at least one D-type flip-flop (D-FF) for holding data. The D-FF can be a part of a scan chain and the D-FF can be tested by conventional scan test. The interconnecting lines are interconnected by programmable interconnect points 203 (PIPs, shown as small dots in FIG. 2). PIPs are often coupled into groups (e.g. group 204) that implement multiplexer circuits selecting one of several interconnecting lines to provide a signal to a destination interconnecting line or the logic block 201. The PIPs 203 are controlled by control signals based on the configuration data stored in the configuration memory block 205 to form routing networks. Routing networks are conventionally lines for data among logic blocks and I/O blocks, but in this invention, routing networks are also used as auxiliary power supply. The configuration memory block 205 comprises a plurality of latch circuits and stores configuration data.

Figure 3:
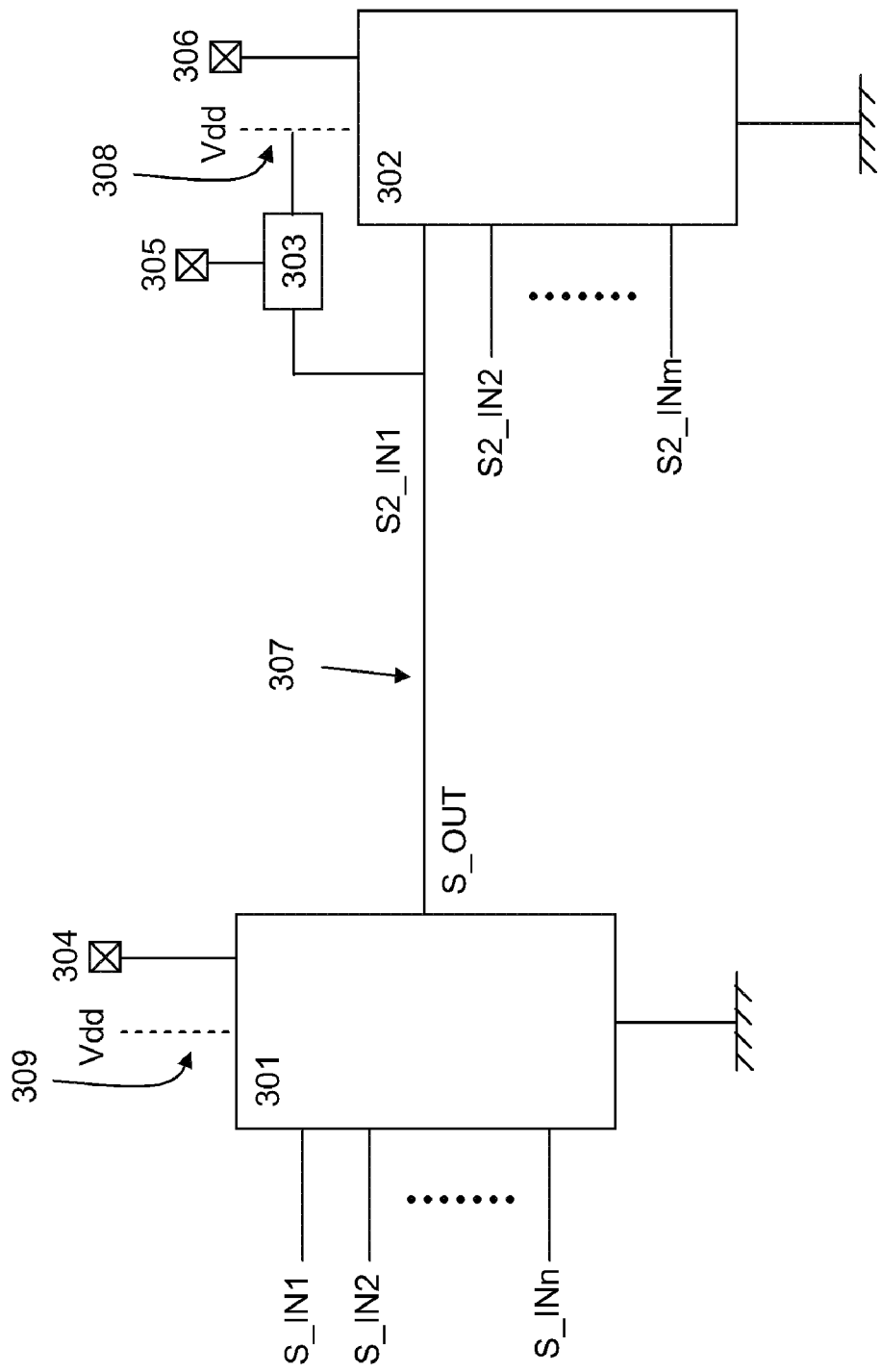
FIG. 3 is a diagram illustrating a simplified structure of a part of routing networks according to a first embodiment.

FIG. 3 shows simplified structure of a part of routing networks of this embodiment. This part comprises a first selection circuit 301, a second selection circuit 302 and an auxiliary power connector circuit 303. Power supply voltage Vdd is applied to the first selection circuit 301 and the second selection circuit 302. Dashed lines signify dedicated power supply lines which carry a constant positive voltage equivalent to a logical "1", independent of the configuration of the device or the behaviour of the application. The power supply voltage Vdd propagates in the dedicated power supply lines, but IR drops occur and voltage of some part of the dedicated power supply lines can be lower than the power supply voltage Vdd.

The first selection circuit 301 receives n input signals including S_IN1, S_IN2, and S_INn and outputs either a calculated result of the input signals (e.g. simply outputs one of the input signals, outputs logical AND result of two of the input signals, outputs logical OR result of all of the input signals, and so on) when in a calculation operative state, or a logical 1 which is substantially equal to the power supply voltage Vdd, as a signal S_OUT when in a supplemental operative state according to a control signal from control bits 304.

The second selection circuit 302 receives m input signals including S2_IN1, S2_IN2, and S2_INm and outputs a calculated result of the input signals (e.g. simply outputs one of the input signals, outputs logical AND result of two of the input signals, outputs logical OR result of all of the input signals, and so on) according to a control signal from control bits 306. The second selection circuit 302 can be configured to also output the logical 1 according to the control signal from control bits 306, but in this embodiment the second selection circuit 302 simply outputs the calculated result of the input signals. And in this embodiment the second selection circuit 302 receives the signal S_OUT from the first selection circuit 301 as the input signal S2_IN1. The signal line 307 which connects the first selection circuit 301 to input of the second selection circuit 302 carries the signal S_OUT. The signal line 307 is also connected to the dedicated power supply line 308 via the switch circuit 303. The switch circuit 303 is controlled by control bit 305.

When the input signal S2_IN1 is used for calculation in the selection circuit 302, the control signal from the control bits 304 configure the selection circuit 301 to output the calculated result as S_OUT. In this case the switch circuit 303 is controlled to be in nonconductive state by the control bits 305 and the signal line 307 is electrically not connected to the power supply line 308.

When the input signal S2_IN1 is NOT used for calculation in the selection circuit 302, the control signal from the control bits 304 configure the selection circuit 301 to output the logical 1 as S_OUT. Voltage of the signal line 307 is substantially same as the power supply voltage Vdd. The switch circuit 303 is controlled to be in conductive state by the control bit 305 and the signal line 307 is electrically connected to the power supply line 308. The power supply voltage Vdd is provided to the dedicated power supply line 308 from power supply, and also from the signal line 307. The signal line 307 works as an auxiliary power supply line to the selection circuit 302. If the strong IR drop occurs in neighbourhood of the selection circuit 302 and the voltage of dedicated power supply line 309 which is in neighbourhood of the selection circuit 301 is higher than that of the dedicated power supply voltage 308, the signal line 307 supplements the power supply of the selection circuit 302 and can contribute to improve speed of the calculation in the selection circuit 302. This results in increasing the maximum operating frequency of the whole device.

According to the first embodiment, a programmable logic device includes a plurality of logic blocks and a routing network. The routing networks comprises: a first selection circuit 301 configured to received a plurality of first input signals and to generate a first output signal; a second selection circuit 302 configured to receive a plurality of second input signals and to generate a second output signal, wherein one of the plurality of second input signals is the first output signal from the first selection circuit; an auxiliary power connector circuit 308 coupled to the first and second selection circuits via a switch circuit 303; and a control portion for providing control signals to the first and second selection circuits, and to the switch circuit, the control portion configured to selectively control the first and second selection circuits and the switch circuit so that the first selection circuit supplements a power supply or a ground line to the second selection circuit when the first selection circuit is in a supplemental operative state. The control portion can control the control bits 304, 305, 306 to provide the control signals.

The control portion provides a control signal (via control bit 305) to places the switch circuit 303 in a conductive state to connect the first selection circuit 301 to one of the power supply or the ground line of the second selection circuit 302 when the first selection circuit 301 is in the supplemental operative state, and places the switch circuit 303 in a non-conductive state when the second selection circuit 302 is in calculation operative state.

Embodiment 2

Figure 4:
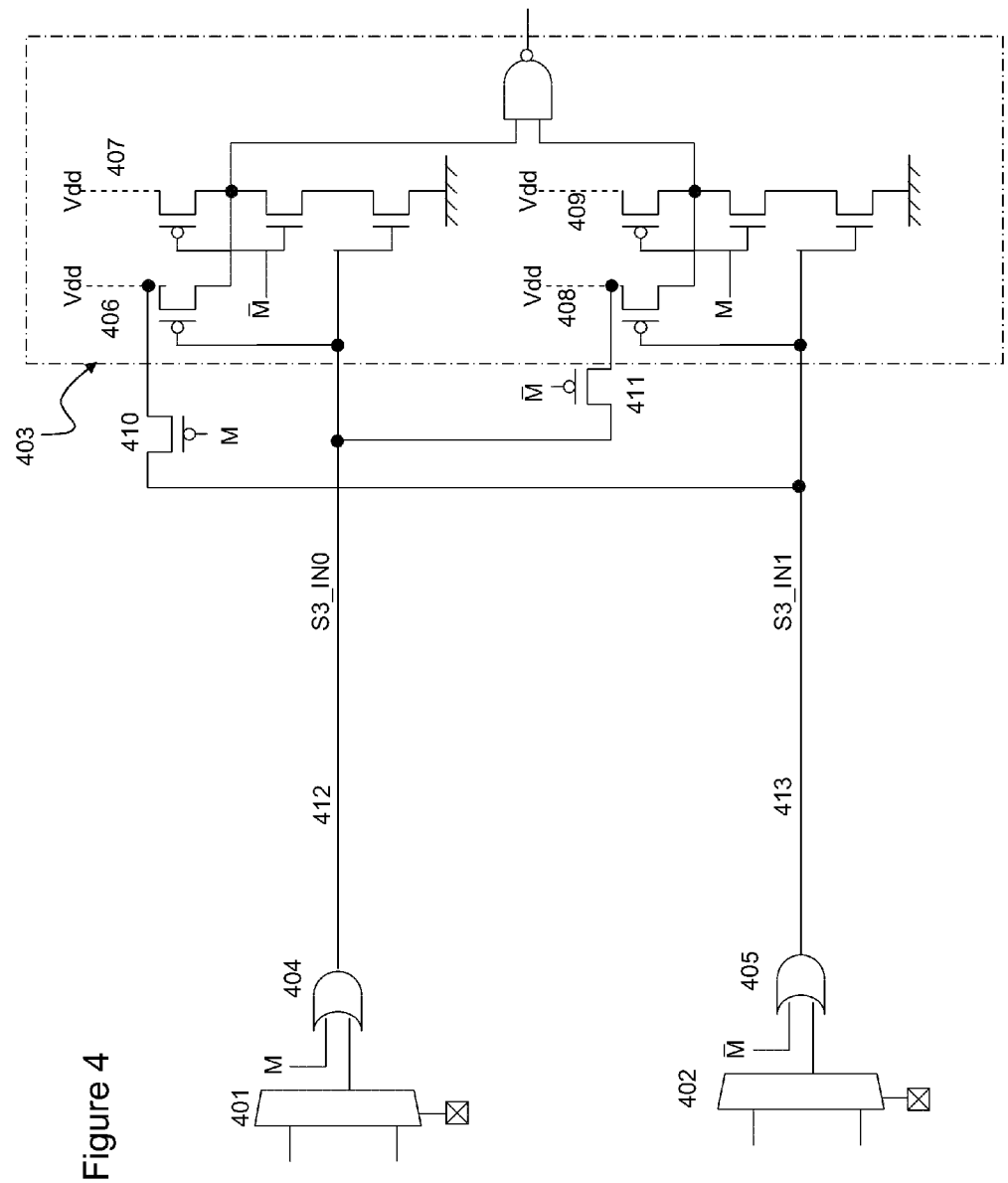
FIG. 4 is a diagram illustrating a simplified structure of a part of routing networks according to a second embodiment.

FIG. 4 illustrate exemplary components of a part of the routing networks according to this embodiment. This part comprises a multiplexer 401, a multiplexer 402, a multiplexer 403, an OR-gate 404, an OR-gate 405, a pMOS transistor 410 and a pMOS transistor 411. Dashed lines 406, 407, 408 and 409 signify dedicated power supply lines. Other lines without ground lines are signal lines.

The output signal of the multiplexer 401 and signal M provided by control bit (not shown in FIG. 4) are input to the OR-gate 404. The output signal of the multiplexer 402 and signal (which is the inverse of the signal M provided by a control bit and not shown in FIG. 4) are input to the OR-gate 405. The output signal of the OR-gate 404 is input into the multiplexer 403 as an input signal S3_IN0. The output signal of the OR-gate 405 is input into the multiplexer 403 as an input signal S3_IN1.

When the signal S3_IN0 is selected by the multiplexer 403 and output from the multiplexer 403, the signal M provided by the control bit is configured to be a logical 0. The OR-gate 404 simply outputs the signal from the multiplexer 401 and the input signal S3_IN0 is the same as the output signal of the multiplexer 401. is a logical 1, and the signal S3_IN1, which is the same as output of the OR-gate 405, is also logical 1. As the signal M is configured to be logical 0, the pMOS transistor 410 is in conductive state. Then a signal line 413 which carries the signal S3_IN1 is electrically connected to the dedicated power supply line 406. The dedicated power supply line 406 is supplemented by the signal line 413 because the voltage of the signal line 413 is the same as that of the dedicated power supply line 406.

When the signal S3_IN1 is selected by the multiplexer 403 and output from the multiplexer 403, the signal M is configured to be a logical 1. The OR-gate 405 simply outputs the signal from the multiplexer 402 and the input signal S3_IN1 is the same as the output signal of the multiplexer 402. The signal M is logical 1, and the signal S3_IN0, which is the same as output of the OR-gate 404, is also logical 1. As the signal is configured to be logical 0, the pMOS transistor 411 is in conductive state. Then a signal line 412 which carries the signal S3_IN0 is electrically connected to the dedicated power supply line 408. The dedicated power supply line 408 is supplemented by the signal line 412 because the voltage of the signal line 412 is the same as that of the dedicated power supply line 408. Data stored in the control bits are decided by the toolchain.

One limitation of the current embodiment is the fact that signal lines 412 and 413 cannot connect to components other than 403, because the one configuration bit M controls both the selection of the inputs of 403 and the enablement of the auxiliary power supply. This limitation will be relaxed in the next, modified, example of the embodiment.

According to a second embodiment, a programmable logic device includes a plurality of logic blocks and a routing network. The routing networks comprises: a first selection circuit 401 configured to received a plurality of first input signals and to generate a first output signal; a second selection circuit 403 configured to receive a plurality of second input signals and to generate a second output signal, wherein one of the plurality of second input signals is the first output signal from the first selection circuit; an auxiliary power connector circuit 408 coupled to the first and second selection circuits via a switch circuit 411; and a control portion for providing control signals to the first and second selection circuits, and to the switch circuit, the control portion configured to selectively control the first and second selection circuits and the switch circuit so that the first selection circuit supplements a power supply or a ground line to the second selection circuit when the first selection circuit is in a supplemental operative state.

The programmable logic device according to the second embodiment further includes a third selection circuit 402 configured to receive a plurality of third input signals and to generate a third output signal and another auxiliary power connector circuit 406 coupled to the third and second selection circuits via another switch circuit 410. One of the plurality of second input signals received by the second selection circuit 403 is the third output signal from the third selection circuit, The control portion is further configured to provide control signals to the first, second and third selection circuits 401, 403, 402, and to the switch circuit 411 and the another switch circuit 410 so that the first or the third selection circuit 410 supplements the power supply or the ground line to the second selection circuit when the third selection circuit 403 is in a supplemental operative state.

Modified Example of the Embodiment 2

Figure 5:
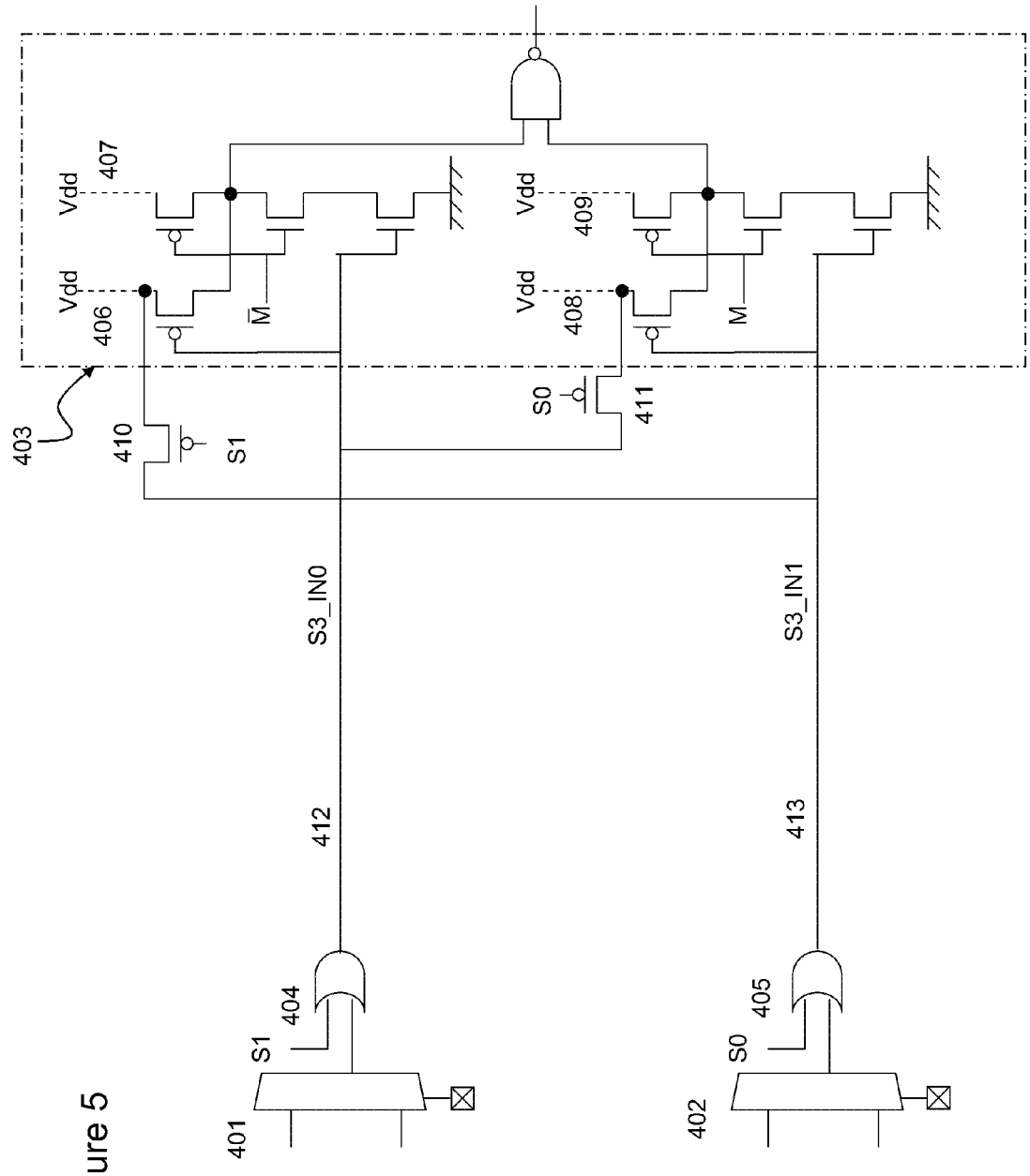
FIG. 5 is a diagram illustrating a simplified structure of a part of routing networks according to a modification to the second embodiment.

FIG. 5 illustrate exemplary components of a part of the routing networks of this embodiment. Difference between the part illustrated in FIG. 4 and the part illustrated in FIG. 5 is control signals provided to the OR-gate 404, 405, the pMOS transistor 410 and 411. A control signal S1 is provided by control bit not shown in FIG. 5 to the OR-gate 404 and to the pMOS transistor 411. A control signal S0 is provided by another control bit not shown in FIG. 5 to the OR-gate 405 and the pMOS transistor 410. The control signal S0 and S1 are independent from the control signal M. The benefit of this structure is that signal lines 412 and 413 can fan out to other components as well as multiplexer 403. This is enabled by the presence of two extra configuration bits S0 and S1, which independently control the enablement of the auxiliary power supply, whereas M controls the behaviour of multiplexer 403.

Embodiment 3

Figure 6:
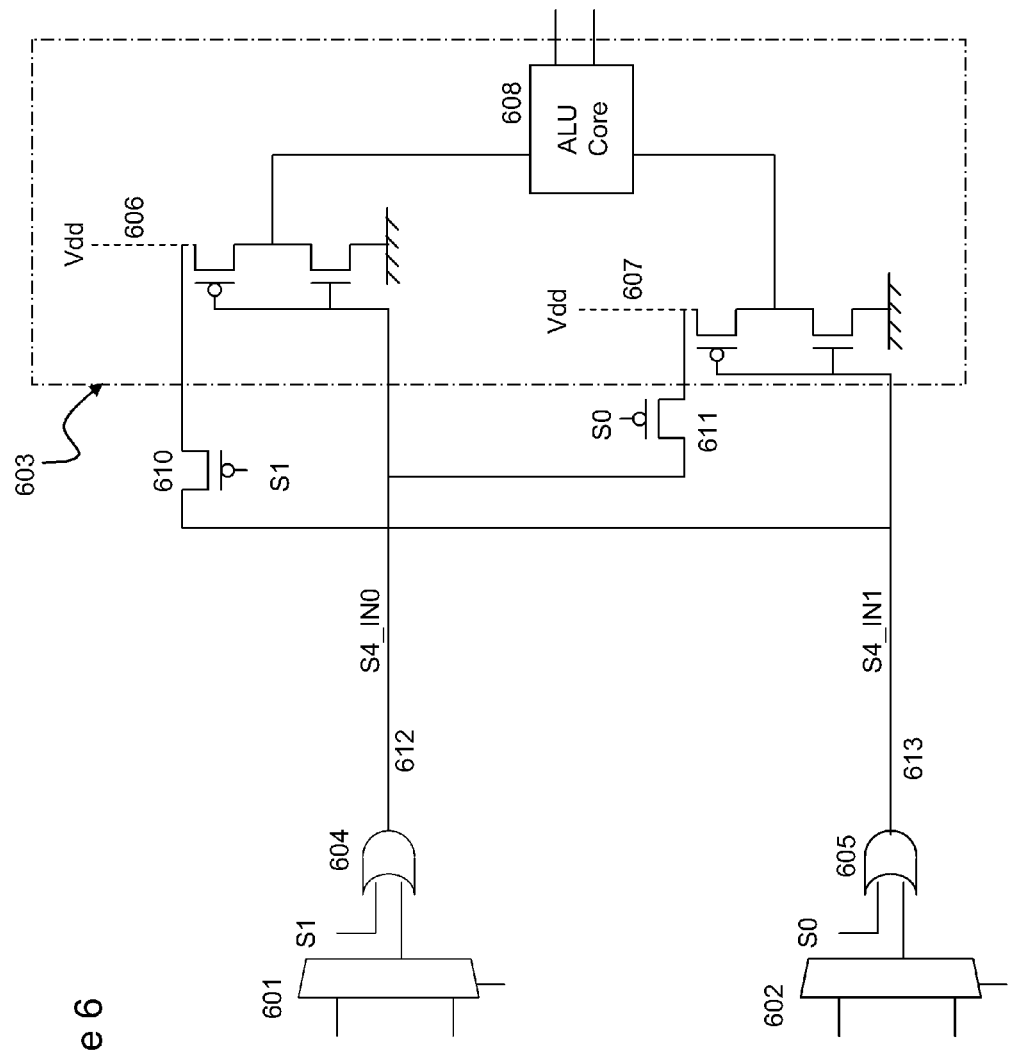
FIG. 6 is a diagram illustrating a simplified structure of a part of routing networks according to a third embodiment.

FIG. 6 illustrate exemplary components of a part of the routing networks of this embodiment. This part comprises a multiplexer 601, a multiplexer 602, an arithmetic logic unit (hereinafter called ALU) 603, an OR-gate 604, an OR-gate 605, a pMOS transistor 610 and a pMOS transistor 611. The ALU comprises an ALU core 608 which output results of calculation of input signals. Dashed lines 606 and 607 signify dedicated power supply lines. Other lines without ground lines are signal lines.

Output signal of the multiplexer 601 and signal S1 provided by a control bit (not shown in FIG. 6) are input to the OR-gate 604. Output signal of the multiplexer 602 and signal S0 provided by another control bit (not shown in FIG. 6) are input to the OR-gate 605. The output signal of the OR-gate 604 is input into the ALU 603 as an input signal S4_IN0. The output signal of the OR-gate 605 is input into the ALU 603 as an input signal S4_IN1.

When the signal S4_IN0 is used for calculation of the ALU core 608 and the signal S4_IN1 is not used for the calculation of the ALU core 608, the signal S1 is configured to be logical 0 and the signal S0 is configured to be logical 1. The OR-gate 604 simply outputs the signal from the multiplexer 601 and the input signal S4_IN0 is the same as the output signal of the multiplexer 601. The signal S0 is logical 1, and the signal S4_IN1, which is the same as output of the OR-gate 605, is also logical 1. As the signal S1 is configured to be logical 0, the pMOS transistor 610 is in conductive state. Then a signal line 613 which carries the signal S4_IN1 is electrically connected to the dedicated power supply line 606. The dedicated power supply line 606 is supplemented by the signal line 613 because the voltage of the signal line 613 is the same as that of the dedicated power supply line 606.

When the signal S4_IN1 is used for calculation of the ALU core 608 and the signal S4_IN0 is not used for the calculation of the ALU core 608, the signal S0 is configured to be logical 0 and the signal S1 is configured to be logical 1. The OR-gate 605 simply outputs the signal from the multiplexer 602 and the input signal S4_IN1 is the same as the output signal of the multiplexer 602. The signal S1 is logical 1, and the signal S4_IN0, which is the same as output of the OR-gate 604, is also logical 1. As the signal S0 is configured to be logical 0, the pMOS transistor 611 is in conductive state. Then a signal line 612 which carries the signal S4_IN0 is electrically connected to the dedicated power supply line 607. The dedicated power supply line 607 is supplemented by the signal line 612 because the voltage of the signal line 612 is the same as that of the dedicated power supply line 607.

When both of the signals S4_IN0 and S4_IN1 are used for calculation of the ALU core 608, both of the signals S1 and S2 are configured to be logical 0. In this case output of the multiplexer 601 and the multiplexer 602 are simply input into the ALU 603. Data stored in the control bits are decided by the toolchain.

Embodiment 4

Figure 7:
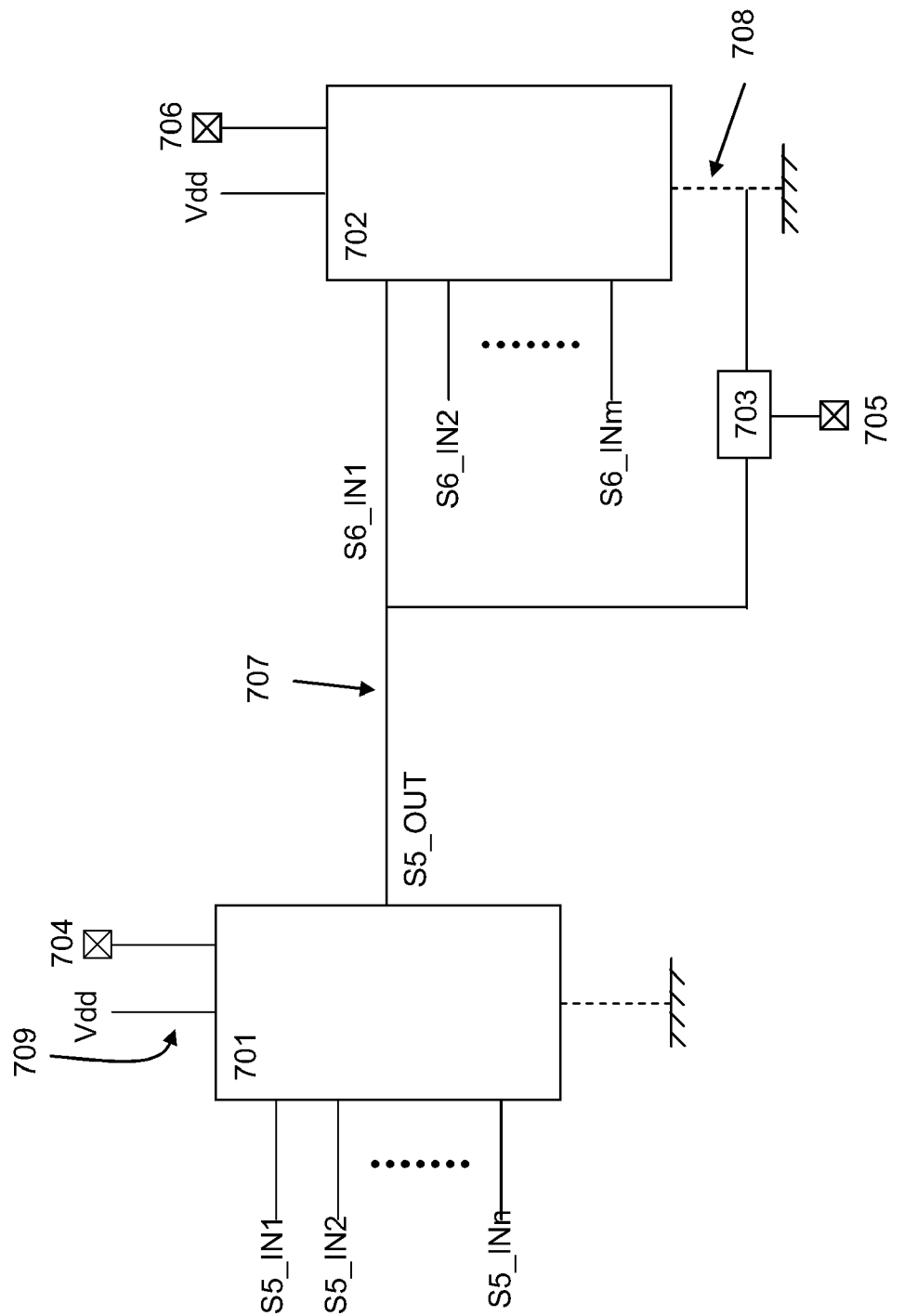
FIG. 7 is a diagram illustrating a simplified structure of a part of routing networks according to a fourth embodiment.

With similar manner to the above mentioned embodiments which supplement the power supply, the ground lines are also supplemented by signal lines. FIG. 7 shows simplified structure of a part of routing networks of this embodiment. This part comprises a first selection circuit 701, a second selection circuit 702 and a switch circuit 703. Power supply voltage Vdd is applied to the first selection circuit 701 and the second selection circuit 702. Dashed lines signify dedicated ground lines which carry a reference voltage (0V), independently of the configuration or activity of the device. The ground voltage propagates in the dedicated power supply lines.

The first selection circuit 701 receives n input signals including S5_IN1, S5_IN2, and S5_INn and outputs either a calculated result of the input signals (e.g. simply outputs one of the input signals, outputs logical AND result of two of the input signals, outputs logical OR result of all of the input signals, and so on), or a logical 0 which is substantially equal to the ground voltage, as a signal S5_OUT according to a control signal from control bits 704.

The second selection circuit 702 receives m input signals including S6_IN1, S6_IN2, and S6_INm and outputs a calculated result of the input signals (e.g. simply outputs one of the input signals, outputs logical AND result of two of the input signals, outputs logical OR result of all of the input signals, and so on) according to a control signal from control bits 706. The second selection circuit 702 can be configured to also output the logical 0 according to the control signal from control bits 706, but in this embodiment the second selection circuit 702 simply outputs the calculated result of the input signals. And in this embodiment the second selection circuit 702 receives the signal S5_OUT from the first selection circuit 701 as the input signal S6_IN1. The signal line 707 which connects the first selection circuit 701 to input of the second selection circuit 702 carries the signal S_OUT. The signal line 707 is also connected to the dedicated ground line 708 via the switch circuit 703. The switch circuit 703 is controlled by control bits 705.

When the input signal S6_IN1 is used for calculation in the selection circuit 702, the control signal from the control bits 704 configure the selection circuit 701 to output the calculated result as S5_OUT. In this case the switch circuit 703 is controlled to be in nonconductive state by the control bits 705 and the signal line 707 is electrically not connected to the ground line 708.

When the input signal S6_IN1 is NOT used for calculation in the selection circuit 702, the control signal from the control bits 704 configure the selection circuit 701 to output the logical 0 as S5_OUT. Voltage of the signal line 707 is substantially same to the ground voltage. The switch circuit 703 is controlled to be in conductive state by the control bits 705 and the signal line 707 is electrically connected to the ground line 708. The ground voltage is provided to the dedicated ground line 708 from the ground, and also from the signal line 707. The signal line 707 works as an auxiliary ground line to the selection circuit 702. This results in enforcing the dedicated ground line and increasing the maximum operating frequency of the whole device.

Industrial Applicability

This technology can be used in several chips in electrical devices, such as TVs, cell phones, and so on.

The invention claimed is:

1. A programmable logic device comprising a plurality of logic blocks and a routing network, wherein the routing network comprises:
 a first selection circuit configured to receive a plurality of first input signals and to generate a first output signal;
 a second selection circuit configured to receive a plurality of second input signals and to generate a second output signal, wherein one of the plurality of second input signals is the first output signal from the first selection circuit;
 an auxiliary power connector circuit coupled to the first and second selection circuits via a switch circuit; and
 a control portion for providing control signals to the first and second selection circuits, and to the switch circuit, the control portion configured to selectively control the first and second selection circuits and the switch circuit so that the first selection circuit supplements a power supply or a ground line to the second selection circuit when the first selection circuit is in a supplemental operative state.

2. The programmable logic device of claim 1, wherein the control portion places the switch circuit in a conductive state to connect the first selection circuit to one of the power supply or the ground line of the second selection circuit when the first selection circuit is in the supplemental operative state, and places the switch circuit in a non-conductive state when the second selection circuit is in calculation operative state.

3. The programmable logic device of claim 1, further comprising:
a third selection circuit configured to receive a plurality of third input signals and to generate a third output signal; and
another auxiliary power connector circuit coupled to the third and second selection circuits via another switch circuit,
wherein one of the plurality of second input signals received by the second selection circuit is the third output signal from the third selection circuit, wherein the control portion is further configured to provide control signals to the first, second and third selection circuits, and to the switch circuit and the another switch circuit so that the third selection circuit supplements the power supply or the ground line to the second selection circuit when the third selection circuit is in a supplemental operative state.

4. The programmable logic device of claim 3, wherein the control portion places the another switch circuit in a conductive state to connect the third selection circuit to one of the power supply or the ground line of the second selection circuit when the third selection circuit is in the supplemental operative state, and places the another switch circuit in a non-conductive state when the third selection circuit is in calculation operative state.

5. The programmable logic device of claim 1, wherein the second selection circuit includes an arithmetic logic unit (ALU), and the second output signal is a result of calculation of the plurality of second input signals.

6. A programmable logic device comprising a plurality of logic blocks and a routing network, wherein the routing network comprises:
a functional circuit configured to receive a plurality of input signals and to generate an output signal from said plurality of input signals;
an auxiliary power connector circuit coupled to said functional circuit via a switch circuit, wherein said auxiliary power connector circuit shares a part of a signal line that is for one of said plurality of input signals; and
a control portion for providing control signals to said functional circuit and to said switch circuit, the control portion configured to selectively control said functional circuit and said switch circuit so that said signal line supplements a power supply or a ground line to said functional circuit when said functional circuit is configured to generate said output signal independent of said signal line.

7. A programmable logic device comprising a plurality of logic blocks and a routing network, wherein the routing network comprises:
a functional circuit configured to receive a plurality of input signals and to generate an output signal from said plurality of input signals;
an auxiliary power connector circuit coupled to a power supply line of said functional circuit via a switch circuit, wherein said auxiliary power connector circuit shares a part of a signal line that is for one of said plurality of input signals; and
a control portion for providing control signals to said switch circuit, the control portion configured to selectively control said switch circuit so that said signal line is electrically connected to said power supply line.

8. A programmable logic device comprising a plurality of logic blocks and a routing network, wherein the routing network comprises:
a functional circuit configured to receive a plurality of input signals and to generate an output signal from said plurality of input signals;
an auxiliary power connector circuit coupled to a ground line of said functional circuit via a switch circuit, wherein said auxiliary power connector circuit shares a part of a signal line, on the other side of said ground line, that is for one of said plurality of input signals; and
a control portion for providing control signals to said switch circuit, the control portion configured to selectively control said switch circuit so that said signal line is electrically connected to said ground line.

* * * * *